Figure 1:
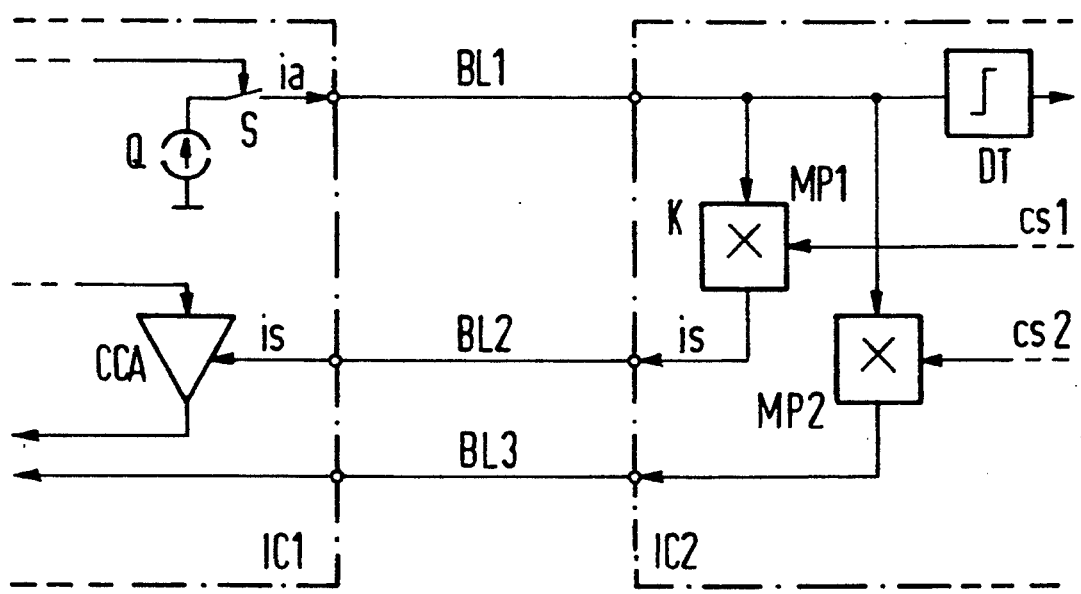

United States Patent [19]

Bardl et al.

[11] Patent Number: 5,402,017

[45] Date of Patent: Mar. 28, 1995

[54] CONTROLLABLE CIRCUIT CONFIGURATION FOR COMPENSATING FLUCTUATIONS IN AN AMPLIFIER

[75] Inventors: Artur Bardl, München; Manfred Lindner, Unterhaching; Emil Navratil, München, all of Germany

[73] Assignee: Siemens Aktiengesellschaft, Munich, Germany

[21] Appl. No.: 276,760

[22] Filed: Jul. 18, 1994

Related U.S. Application Data

[63] Continuation of Ser. No. 919,300, Jul. 24, 1992, abandoned.

[30] Foreign Application Priority Data

Jul. 24, 1991 [DE] Germany .................. 41 24 585.7

[51] Int. Cl.$^6$ ............................................. G06G 7/12
[52] U.S. Cl. .................................. 327/362; 327/513; 327/538
[58] Field of Search .................. 307/491, 310, 493; 330/289

[56] References Cited

U.S. PATENT DOCUMENTS

| | | | |
|---|---|---|---|
| 4,168,492 | 9/1979 | Uya | 307/310 |
| 4,588,909 | 5/1986 | Quan | 307/491 |
| 4,734,598 | 3/1988 | Böhme | 307/491 |
| 4,791,385 | 12/1988 | Wermuth | 307/493 |
| 4,883,992 | 11/1989 | Koglin et al. | 307/310 |
| 5,006,727 | 4/1991 | Ragosch et al. | 307/491 |
| 5,079,453 | 1/1992 | Tisinger et al. | 307/491 |
| 5,116,136 | 5/1992 | Newman et al. | 307/310 |
| 5,131,046 | 7/1992 | Killion et al. | 330/254 |
| 5,200,655 | 4/1993 | Feldt | 307/310 |

FOREIGN PATENT DOCUMENTS 0271947  6/1988  European Pat. Off. .

OTHER PUBLICATIONS

"Der OTA-Eine Weiterentwicklung des Operationsverstärkers", Elektronik vol. 7, 1973, pp. 247–251.
"Ein Stromprogrammierbarer Operationsverstärker in Anwendungsbeispielen" Wilfried Blaesner Der Elektroniker vol. 9, 1986, pp. 58–62.
"ICs for Communications" Data Book 1989, pp. 782–811.
"Linear Databook 1", 1988 Edition, pp. 516–553.

Primary Examiner—Timothy P. Callahan
Assistant Examiner—Toan Tran
Attorney, Agent, or Firm—Herbert L. Lerner; Laurence A. Greenberg

[57] ABSTRACT

A circuit configuration includes a final control element being adjustable as a function of a control current, wherein the function is subject to certain fluctuations and variations. A constant current source supplies an output current being equally subject to the certain fluctuations and variations. A multiplier is connected between the constant current source and the final control element, for varying the current output by the constant current source by a factor being dependent on a control signal, and for delivering the current output by the constant current source to the final control element as the control current.

7 Claims, 2 Drawing Sheets

CONTROLLABLE CIRCUIT CONFIGURATION FOR COMPENSATING FLUCTUATIONS IN AN AMPLIFIER

This application is a continuation of application Ser. No. 07/919,300, filed Jul. 24, 1992, abandoned.

The invention relates to a controllable circuit configuration.

The transmission properties of bipolar circuits, particularly in telephone circuit applications, are determined largely by discrete components such as resistors, capacitors and chokes. For instance, in speech circuits for telephone terminal devices, external resistors which are used to adjust the total amplification assure high accuracy and replicability that is independent of production variations, and they permit variation of the amplifications in the transmit and receive directions. One such circuit is known, for instance, from an article in the Siemens Data Book 1989/90, entitled ICs for Communication, PSB 4505/4506, pp. 782-811.

In order to vary the amplification, the external components that are involved are typically replaced or recalibrated. However, that entails some effort, especially with later corrections. It would therefore be highly useful to set various parameters in as highly automated a way as possible, preferably under software control, especially for adapting the amplification and other parameters to the various regulations for telephone systems in various countries. In known circuit concepts, that is generally possible only at considerable additional expense for circuitry, and in particular it requires a greater number of external components.

It is accordingly an object of the invention to provide a controllable circuit configuration, which overcomes the hereinafore-mentioned disadvantages of the heretofore-known devices of this general type and which involves little circuitry expense.

With the foregoing and other objects in view there is provided, in accordance with the invention, a circuit configuration, comprising a final control element being adjustable as a function of a control current, the function being subject to certain fluctuations and variations; a constant current source supplying an output current being equally subject to the certain fluctuations and variations; and a multiplier connected between the constant current source and the final control element, for varying the current output by the constant current source by a factor being dependent on a control signal, and for delivering the current output by the constant current source to the final control element as the control current.

In accordance with another feature of the invention, a linear function exists between the factor and the control signal.

In accordance with a further feature of the invention, a logarithmic function exists between the factor and the control signal.

In accordance with an added feature of the invention, the multiplier has a current mirror configuration with a translation ratio being adjustable as a function of the control signal.

In accordance with an additional feature of the invention, the control signal is a binary encoded data word, and the current mirror configuration has a current bank with outputs to be switched to the final control element as a function of the data word.

In accordance with yet another feature of the invention, the final control element and the constant current source are made by one technology and the multiplier is made by another technology.

In accordance with a concomitant feature of the invention, there is provided a current detector connected to the constant current source, and means for switching the constant current source on and off.

The advantages of the invention include not only the low overall cost for circuitry but also the capability of complete integration, the ability to make an analog bus system at low expense, and the possibility of software control.

Other features which are considered as characteristic for the invention are set forth in the appended claims.

Although the invention is illustrated and described herein as embodied in a controllable circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
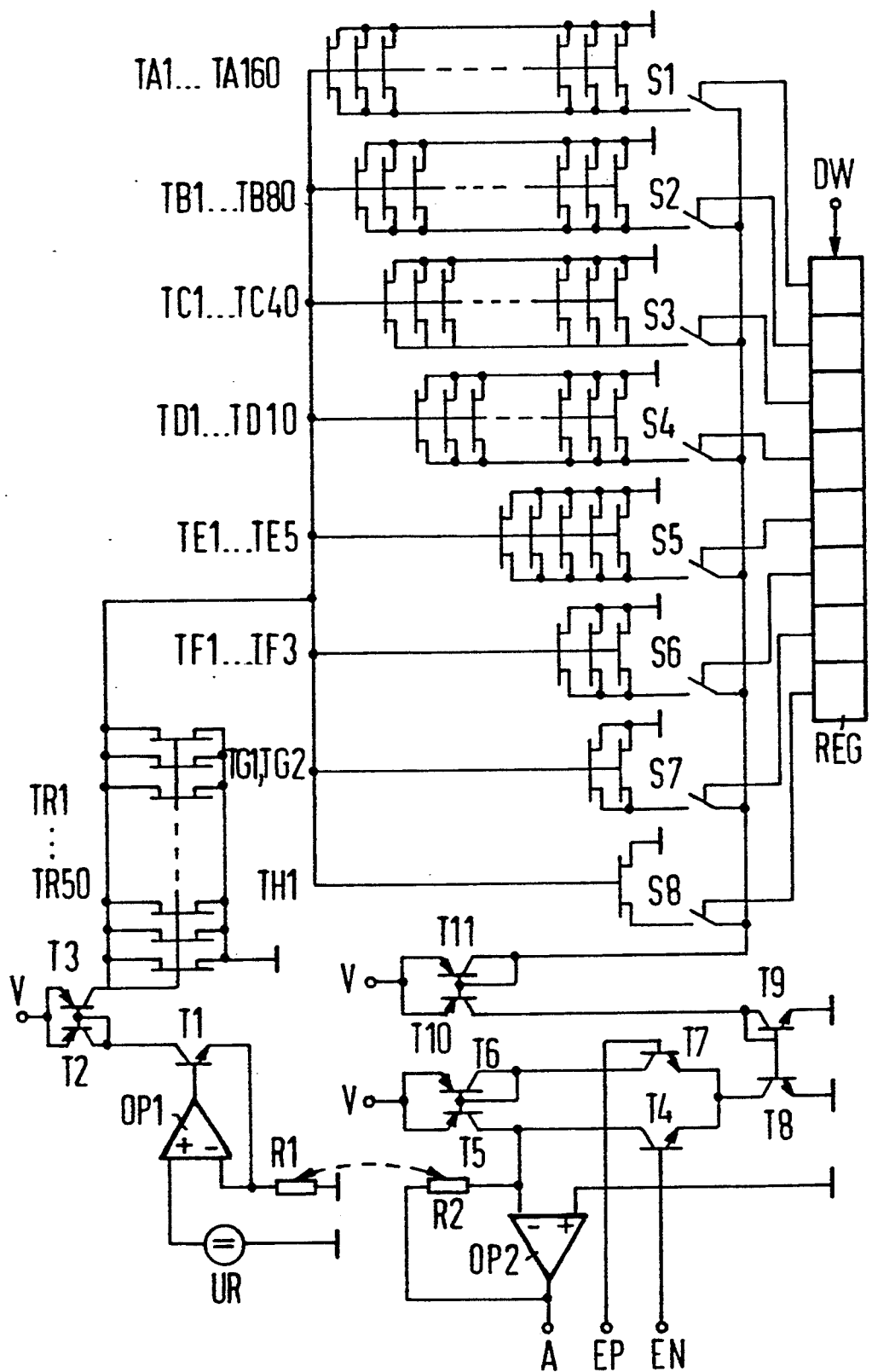

FIG. 1 is a schematic circuit diagram of a first, general embodiment of a circuit configuration according to the invention; and FIG. 2 is a circuit diagram of a second, more detailed embodiment of a circuit configuration according to the invention.

Referring now to the figures of the drawing in detail and first, particularly, to FIG. 1 thereof, there is seen a circuit configuration according to the invention that includes a current-controlled amplifier CCA as a final control element, which is adjustable by a control current is in dependence on certain fluctuations and variations, and has a constant current source Q with an output current ia that is equally subject to the certain fluctuations and variations. The current-controlled amplifier CCA and the constant current source Q are integrated into a circuit IC1. These fluctuations in the current-controlled amplifier CCA and the constant current source Q are dependent on external influences, such as production-dictated variations and temperature. In order to bring these fluctuations into agreement, both of these components are integrated into a single circuit. Moreover, the elements that are definitive for the fluctuations in the current-controlled amplifier CCA and the constant current source Q are constructed identically, to the maximum possible extent. With integrated circuits, high absolute accuracy of electrical variables for individual elements can be achieved only at relatively major effort and expense, but high relative accuracy between two identically constructed elements can be achieved without major effort or expense.

The output current ia of the constant current source Q is used to adjust the amplification of the current-controlled amplifier CCA. However, the output current ia is subject to production-dictated variation and therefore differs from one circuit to another. Since this current ia is in the same circuit as the control current is for adjusting the amplification of the current-controlled amplifier CCA, which is subject to the same production variations, the production variation averages out. In the same way, the temperature-dictated fluctuations of the constant current source Q and the current-controlled amplifier CCA cancel one another out. The output current ia of the constant current source Q and the control current is of the current-controlled amplifier CCA are linked together through a factor k. The amplification of the current-controlled amplifier CCA can be varied by varying the factor k.

To this end, a multiplier MP1 is connected between the constant current source Q and the current-controlled amplifier CCA. The factor k depends on a control signal cs1 that is delivered to the multiplier MP1. The dependency between the control signal cs1 and the factor k may be arbitrary, and in the exemplary embodiment of FIG. 1 it is linear. The multiplier MP1, a further multiplier MP2 controlled by a control signal cs2 and a detector unit DT, are all integrated in a further circuit IC2. The two circuits IC1 and IC2 are joined together by bus lines BL1, BL2 and BL3. The bus line BL1 couples the inputs of the multipliers MP1 and MP2 and of the detector unit DT to the constant current source Q. The current output of the multiplier MP1 that carries the control current is is connected to a control input of the current-controlled amplifier CCA by the bus line BL2. The bus line BL3 connects a non-illustrated final control element of the integrated circuit IC1 to the current output of the multiplier MP2. This final control element may be a current-controlled amplifier, a current-controlled filter or a current-controlled oscillator. An input and an output of the current-controlled amplifier CCA and a current terminal of a controllable switch S that is connected between the constant current source Q and the bus line BL1, and which is likewise a component of the integrated circuit IC1, are also coupled to the further elements of the integrated circuit IC1. In the same way, other non-illustrated circuit elements of the integrated circuit IC2 are connected to an output of the detector unit DT and to control inputs of the multipliers MP1 and MP2. These further circuit elements also furnish the control signals cs1 and cs2. Through the use of the controlled switch S in combination with the detector unit DT, a signal that indicates the operational readiness of the integrated circuit IC1, for instance, can be transmitted from the integrated circuit IC1 to the integrated circuit IC2.

This is done in such a way that the detector unit DT recognizes whether or not a current is being transmitted from the integrated circuit IC1.

Accordingly, the output current ia that is generated in the integrated circuit IC1, is multiplied by the factor k in the integrated circuit IC2 and redelivered to the current-controlled amplifier CCA in the integrated circuit IC1.

In this way, an arbitrary number of control currents, which is a total of two in the present exemplary embodiment, can be generated from the output current ia of the integrated circuit IC1, and an equal number of control members can be operated with them. Moreover, as is shown in the following exemplary embodiments, it is possible for the two integrated circuits IC1 and IC2 to be based on different technologies.

The circuit configuration according to the invention as shown in FIG. 2 is integrated in a single circuit, but the constant current source and the controllable amplifier are made by bipolar technology while the multiplier is made by MOS technology. By using typical bipolar or MOS properties, especially CMOS properties, a construction is achieved at minimal expense for circuitry.

In the exemplary embodiment shown, the constant current source includes an operational amplifier OP1 having a non-inverting input that is connected to a reference potential with the interposition of a reference voltage source UR. For example, the reference voltage source UR may be a bandgap reference voltage source. On one hand, the inverting input of the operational amplifier OP1 is connected to the reference potential through a resistor R1 and on the other hand it is connected to the emitter of an npn transistor T1. The output of the operational amplifier is carried to the base of the transistor T1, which has a collector coupled to the collector and the base of a pnp transistor T2 and to the base of a pnp transistor T3. The emitters of the transistors T2 and T3 are connected to a supply potential V. The current-controlled amplifier also includes an operational amplifier OP2, which is negatively fed back between the output and the inverting input thereof through a resistor R2. The output of the operational amplifier OP2 is also connected to an output terminal A. The non-inverting input of the operational amplifier is applied to reference potential, while the inverting output is connected not only to the resistor R2 but also to the collector of an npn transistor T4 and to the collector of a pnp transistor T5. The emitter of the transistor T5 and the emitter of a pnp transistor T6 are connected to the supply potential V. The transistor T6 has a collector and a base that are coupled to the base of the transistor T5. The collector of the transistor T6 is also connected to the collector of an npn transistor T7 having an emitter connected to the emitter of the transistor T4 and to the collector of an npn transistor T8. The bases of the two transistors T4 and T7 form respective symmetrical inputs EN and EP of the current-controlled amplifier. The base of the transistor T8 is connected to the base and the collector of an npn transistor T9 having an emitter which is at reference potential, like the emitter of the transistor T8. The collector of the transistor T9 is coupled to the collector of a pnp transistor T10 having a base which is connected to the base and the collector of a pnp transistor T11. The emitters of the transistors T10 and T11 are connected to the supply potential V.

The absolute accuracy of the constant current source and the current-controlled amplifier in the exemplary embodiment of FIG. 2 depends substantially on the resistors R1 and R2. In conventional circuit structures, these resistors are therefore constructed as external, discrete resistors. They are far less subject to production-dictated variations and temperature-dependent fluctuations. In contrast, in the circuit configuration of the invention these resistors, namely the resistors R1 and R2, are integrated with the circuit. Instead of high absolute accuracy, high relative accuracy, which is substantially simpler to attain, is sought. It is achieved especially if the two resistors R1 and R2 are constructed identically. If different resistances are needed for R1 and R2, then the desired value can be achieved, preferably by connecting identical resistors in parallel and/or in series. The other components in the constant current source and the current-controlled amplifier are essentially unimportant in this configuration, in terms of production-dictated variations and temperature-dependent fluctuations.

In the circuit configuration of the invention as shown in FIG. 2, the multiplier is constructed as a current mirror configuration, having a translation ratio that is adjustable as a function of a binary-encoded data word DW as a control signal. The current mirror configuration includes a current bank with eight outputs, which can be applied to the current-controlled amplifier as a function of the data word DW, which is written serially (or in parallel) into a register REG and stored there. The eight outputs have different translation ratios with respect to the input to the current bank. The translation ratios in the present exemplary embodiment are selected in such a way that there is a logical relationship between the data word DW and the factor k. It is thus possible for the amplification adjustment to be effected through the data word DW, for example in decibel increments. Therefore, there is a linear or a logarithmic relationship between the data wrod DW and the factor k.

In order to provide exact adaptation of the translation ratios, the input branch and the eight output branches are each made up of identical MOS transistors, the number of which may vary in each case. The input branch of the current bank thus includes 50 MOS transistors TR1 . . . TR50 which are connected in parallel with respect to their gates, drains and source. In each case, the gate and drain are connected to one another and to the collector of the transistor T3, and the respective source terminal is connected to the reference potential. The output branches each include a certain number of MOS field effect transistors, which are connected in parallel with respect to the sources, drains and gates. On the source side, they are connected to the reference potential, and on the drain side they are each connected to one respective controllable switch S1 . . . S8 associated with the corresponding output branch. The gates are coupled to one another and to the drain terminals of the transistors TR1 . . . TR50. Each of the controllable switches S1 . . . S8 is controlled by one bit of the data word DW stored in the register REG. For instance, the data word DW may be written serially into the register REG by means of a non-illustrated control unit. The number of MOS transistors in the various output branches differs depending on the translation ratio that is required at a given time. Thus 160 MOS transistors TA1 . . . TA160 are provided for the output branch associated with the most significant bit of the data word DW, and one MOS transistor TH1 is provided for the output branch associated with the least-significant bit. The other output branches have eighty MOS transistors TB1 . . . TB80, forty MOS transistors TC1 . . . TC40, ten MOS transistors TD1 . . . TD10, five MOS transistors TE1 . . . TE5, three MOS transistors TF1 . . . TF3, and two MOS transistors TG1, TG2, respectively.

Besides the embodiment of a multiplier shown in FIG. 2, other embodiments are also possible. For instance, instead of the single-stage conversion by means of current mirrors or current banks as shown, a split may be made into a plurality of stages, by serially connecting a plurality of current mirrors or current banks, in particular those that are complementary to one another. However, current-controlled current amplifier circuits made with operational transductance amplifiers (OTAs), which have analog or digital triggering, may also be used, or it is possible to use multiplying digital-/analog converters that have a current output. In closing, it should be noted that instead of current banks, which advantageously are made up of identical transistors, a construction with transistors of different sizes is naturally quite possible as well.

We claim:

1. A circuit configuration, comprising:
an adjustable amplifier being adjustable as a function of a control current, the function being subject to fluctuations and variations;
a constant current source supplying an output current being equally subject to the fluctuations and variations; and
a multiplier connected between said constant current source and said adjustable amplifier, for varying the current output by said constant current source by a factor being dependent on a control signal, and means for delivering the current output by said constant current source to said adjustable amplifier as the control current.

2. The circuit configuration according to claim 1, wherein a linear function exists between the factor and the control signal.

3. A circuit configuration, comprising:
a final control element being adjustable as a function of a control current, the function being subject to fluctuations and variations;
a constant current source supplying an output current being equally subject to the fluctuations and variations; and
a multiplier connected between said constant current source and said final control element, for varying the current output by said constant current source by a factor being dependent on a control signal, and means for delivering the current output by said constant current source to said final control element as the control current, wherein a logarithmic function exists between the factor and the control signal.

4. The circuit configuration according to claim 1, wherein said multiplier has a current mirror configuration with a translation ratio being adjustable as a function of the control signal.

5. A circuit configuration, comprising:
a final control element being adjustable as a function of a control current, the function being subject to fluctuations and variations;
a constant current source supplying an output current being equally subject to the fluctuations and variations; and
a multiplier connected between said constant current source and said final control element, for varying the current output by said constant current source by a factor being dependent on a control signal, and means for delivering the current output by said constant current source to said final control element as a control current, wherein said multiplier has a current mirror configuration with a translation ratio being adjustable as a function of the control signal, and wherein the control signal is a binary encoded data word, and said current mirror configuration has a current bank with outputs to be switched to said final control element as a function of the data word.

6. The circuit configuration according to claim 1, wherein said adjustable amplifier and said constant current source are made by one technology and said multiplier is made by another technology.

7. The circuit configuration according to claim 1, including a current detector for generating a signal indicating that said circuit configuration is active, connected to said constant current source, and means for switching said constant current source on and off.

* * * * *